(12) United States Patent
Hayashi et al.

(10) Patent No.: US 8,238,839 B2
(45) Date of Patent: Aug. 7, 2012

(54) RECEIVER, TRANSCEIVER, AND MOBILE TERMINAL DEVICE

(75) Inventors: Norio Hayashi, Tokyo (JP); Satoshi Arayashiki, Tokyo (JP); Takeshi Uchitomi, Tokyo (JP); Tomomitsu Kitamura, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 187 days.

(21) Appl. No.: 12/732,393

(22) Filed: Mar. 26, 2010

(65) Prior Publication Data

US 2010/0297956 A1    Nov. 25, 2010

(30) Foreign Application Priority Data

May 21, 2009    (JP) .................................. 2009-122700

(51) Int. Cl.
*H04B 1/40*    (2006.01)
(52) U.S. Cl. ............................. 455/75; 455/87; 455/88

(58) Field of Classification Search .................... 455/75, 455/87, 88, 232.1, 234.2, 522
See application file for complete search history.

(56) References Cited

U.S. PATENT DOCUMENTS

| 7,783,318 B2 * | 8/2010 | Wilson et al. ................. 455/522 |
| 2006/0128334 A1 * | 6/2006 | Ikuta et al. ................. 455/232.1 |

FOREIGN PATENT DOCUMENTS

JP    2006-115345 A    4/2006

* cited by examiner

*Primary Examiner* — Tuan H Nguyen
(74) *Attorney, Agent, or Firm* — Mattingly & Malur, PC

(57) ABSTRACT

Variable operating currents are generated in relation to input signal power and output signal power and achieving both low noise and low power consumption. Emitter follower circuits are attached to output terminals of a frequency divider for generating a local signal. By adjusting the currents flowing through the emitter follower circuits, the amounts of currents flowing into mixers is adjusted. When the amounts of currents of local signals flowing into the mixers increases, the effect of noise suppression is expected. The amounts of the currents flowing through the emitter follower circuits is changed depending on the amplification factor of variable amplifiers.

7 Claims, 16 Drawing Sheets

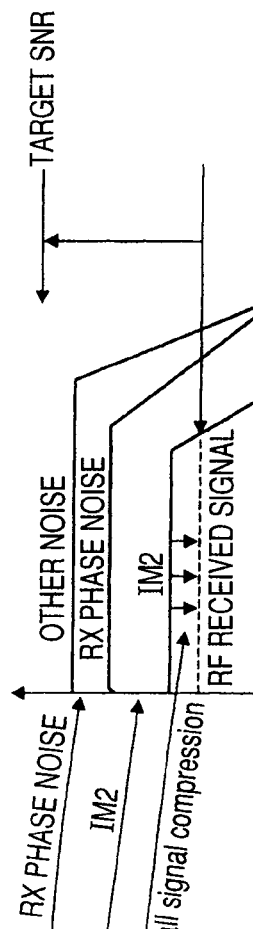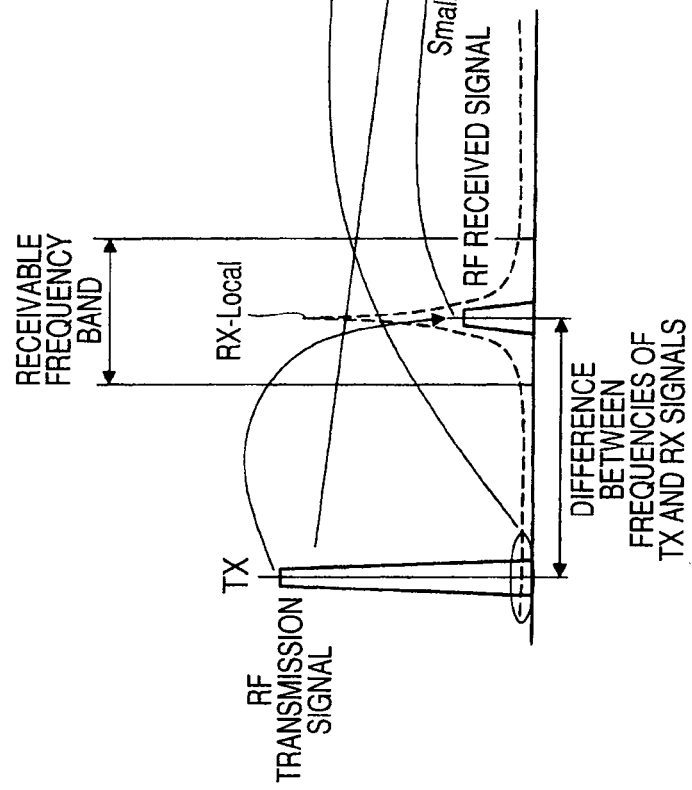
FIG. 3(a)
FIG. 3(b)

RECEIVER, TRANSCEIVER, AND MOBILE TERMINAL DEVICE

CROSS-REFERENCE TO RELATED APPLICATIONS

The disclosure of Japanese Patent Application No. 2009-122700 filed on May 21, 2009 including the specification, drawings and abstract is incorporated herein by reference in its entirety.

BACKGROUND OF THE INVENTION

The present invention relates to a receiver for use in a mobile cellular phone operating with a W-CDMA protocol using FDD. Particularly, the invention relates to the removal of a SAW filter inserted between a low noise amplifier and a mixer in a receiving stage.

A W-CDMA (Wideband Code Division Multiple Access) protocol is a protocol for wireless connection which is used for so-called third generation cellular mobile phones. The W-CDMA is characterized in that signals diffused over a wide band are received and subjected to back diffusion to acquire significant signals. The W-CDMA protocol is performed using an FDD (Frequency Division Duplex) method and a TDD (Time Division Duplex) method. At present, the FDD method is generally used.

The W-CDMA protocol essentially requires a high-performance filter that receives signals diffused over a wide band, while cutting off radio waves of other frequency bands. In addition, parts which are used in a cellular mobile phone or the like are demanded to be smaller and lighter. To satisfy these conditions, a SAW (Surface Acoustic Wave) filter is generally used.

However, the SAW filter is a part and there is a cost for procuring it. A space for installing it must be allocated, though this space is just small. Therefore, if a filterless receiver can be designed, it is most favorable.

Because of such demand, curtailing the number of filters is lately becoming a general practice by using a zero IF (direct conversion) method when modulating an RF frequency band to a baseband frequency band. Such configuration is adopted in a receiver disclosed in Japanese Unexamined Patent Publication No. 2006-115345(Patent Document 1).
[Patent Document 1]
Japanese Unexamined Patent Publication No. 2006-115345

SUMMARY OF THE INVENTION

However, when the zero IF method is simply used, DC offset generation is unavoidable and there is a difficulty in fabricating a stable circuit in which good noise performance is maintained. An immoderate pursuit of maintaining good noise performance gives rise to a problem that the time during which the mobile phone continues to operate before being recharged is shortened by an increase in current consumption.

An object of the present invention is to provide a control method for generating variable operating currents in relation to input signal power and output signal power and achieving both low noise and low power consumption.

The above-noted and other objects and novel features of the present invention will become apparent from the following description in the present specification and the accompanying drawings.

Typical aspects of the invention disclosed in this application are summarized as follows.

A receiver pertaining to an exemplary embodiment of the present invention includes a low noise amplifier which amplifies received signals received via an antenna, a frequency divider which generates a local signal, mixers which mix the local signal and an output of the low noise amplifier, programmable gain amplifiers which amplify outputs of the mixers, and a gain controller which controls the programmable gain amplifiers. The receiver is characterized in that the frequency divider includes a current amount adjustment means for adjusting the amount of currents to be output from its output terminals, a gain controller control signal to control the programmable gain amplifiers is input to the gain controller, and the gain controller adjusts an amplification factor of the programmable gain amplifiers and the amount of currents to be output from the output terminals of the frequency divider according to the gain controller control signal.

This receiver may be characterized in that the current amount adjustment means comprises emitter follower current circuits.

This receiver may be characterized in that a transmission mode flag signal is further input to the receiver and control of the frequency divider by the gain controller is deactivated when the transmission mode flag signal is negative.

A mobile terminal device using the above-described receiver falls within the scope of the present invention.

A transceiver pertaining to an exemplary embodiment of the present invention includes a low noise amplifier which amplifies received signals received via an antenna, a receiver-side frequency divider which generates a receiver-side local signal, mixers for reception which mix the receiver-side local signal and an output of the low noise amplifier, programmable gain amplifiers which amplify outputs of the mixers, a receiver-side gain controller which controls the programmable gain amplifiers, a mixer for transmission which mixes a transmitter-side local signal and an analog baseband signal for transmission, a variable amplifier which amplifies an output of the mixer for transmission, and a transmitter-side gain controller which adjusts an amplification factor of the variable amplifier. The transceiver is characterized in that the frequency divider comprises a current amount adjustment means for adjusting the amount of currents to be output from its output terminals, the transmitter-side gain controller outputs a receiver-side gain controller control signal to the receiver-side gain controller in accordance with an amplification factor of the variable amplifier, and the receiver-side gain controller adjusts the programmable gain amplifiers and the amount of currents to be output from the frequency divider based on the receiver-side gain controller control signal.

A mobile terminal device using this transceiver falls within the scope of the present invention.

Effects obtained by typical aspects of the invention disclosed in the present application are outlined below.

The receiver pertaining to an exemplary embodiment of the present invention does not deteriorate in noise performance, while keeping current consumption low, and allows for the removal of a SAW filter from the receiving stage.

BRIEF DESCRIPTION OF THE DRAWINGS

FIGS. 3(a) and 3(b) are conceptual diagrams representing the proportions of signal components input to the receiver of FIG. 1.

DETAILED DESCRIPTION OF THE PREFERRED EMBODIMENTS

Embodiments of the present invention will be described below, using the drawings.

First Embodiment

Figure 1:
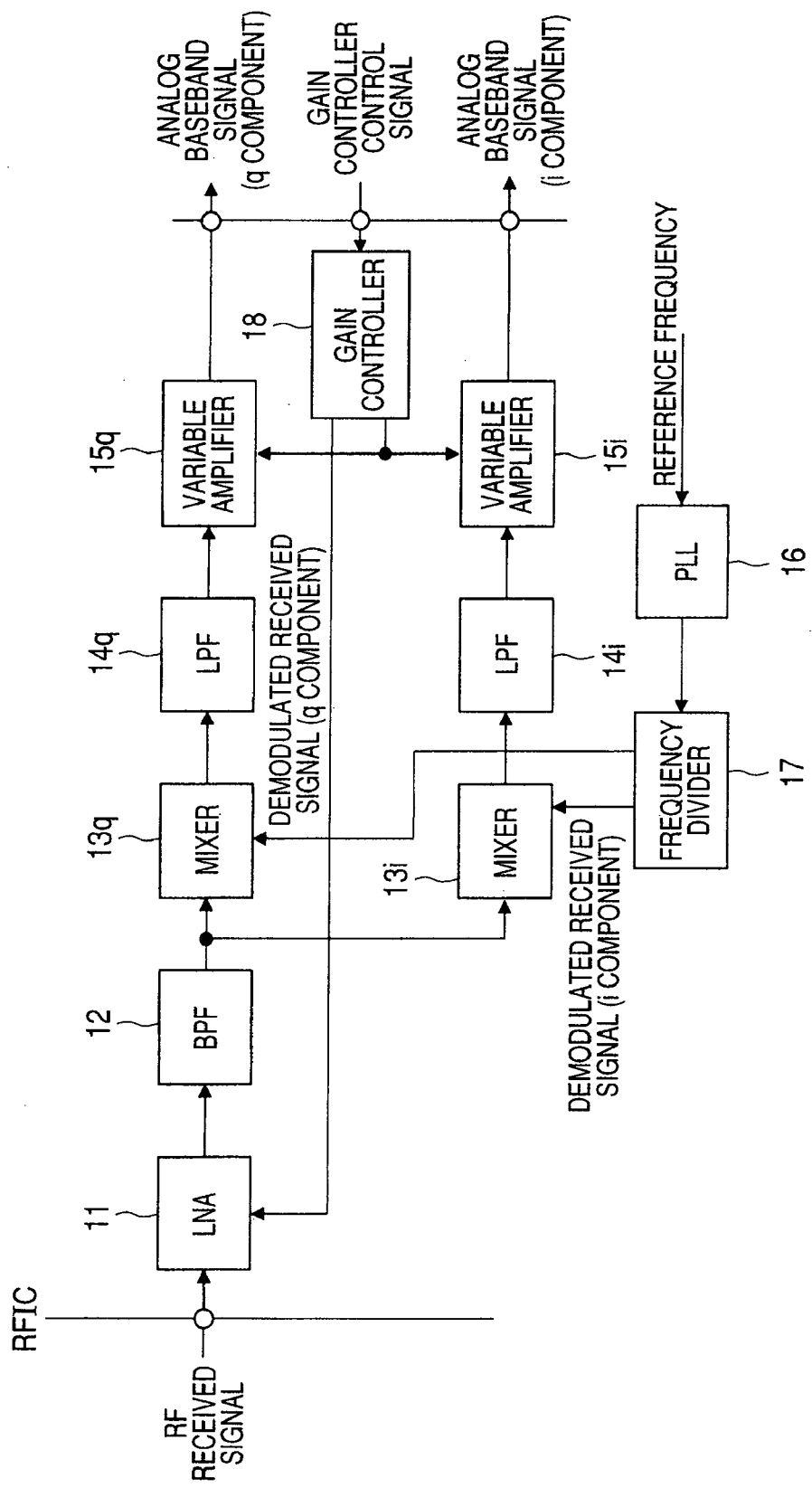
FIG. 1 is a block diagram showing a configuration of a commonly used receiver.

FIG. 1 is a block diagram showing a configuration of a commonly used receiver.

This receiver includes an LNA 11, a BPF 12, mixers 13i, 13q, LPFs 14i, 14q, variable amplifiers 15i, 15q, a PLL 16, a frequency divider 17, and a gain controller 18.

In this figure, RF received signals coming in via an antenna and duplexer (or circulator) are first input to the LNA (Low Noise Amplifier) 11. The LNA 11 amplifies input RF signals to a certain output level. The amplified RF signals are output to the BPF 12.

The LNA 11 is typically capable of switching between two amplification factors.

The BPF 12 is a filter circuit for eliminating signal components in an unwanted band before inputting the signals amplified by the LNA 11 to the mixers. As this filter circuit, a SAW filter is used. An object of the present invention is to remove this filter circuit.

The mixers 13i, 13q are mixer circuits that demodulate the RF signals by multiplying the outputs of the BPF 12 by a local signal. Low frequency components output from these mixers 13i, 13q become baseband signals.

The LPF 14i, 14q are filter circuits for extracting baseband signals from the outputs of the mixers 13i, 13q.

The variable amplifiers 15i, 15q are programmable gain amplifiers for amplifying the baseband signals and outputting analog baseband signals to a host device. Gain control is performed by changing the amplification factor of these variable amplifiers.

The PLL 16 is a PLL (Phase Lock Loop) circuit for generating a high frequency signal using a ring oscillator or the like, based on a reference frequency input thereto. The PLL 16 outputs a standard frequency to the frequency divider 17.

The frequency divider 17 is a circuit for dividing the standard frequency output by the PLL 16 and generating a local signal of a high frequency. A typical frequency divider which is used for a high frequency circuit includes a differential amplifier circuit and an emitter follower circuit. The frequency divider 17 generates two types of local signals. These local signals are phase shifted 90 degrees from each other. The frequency divider outputs a local signal as is to one of the mixers 13i, 13q and a local signal phase-shifted 90 degrees to the other one.

The gain controller 18 is a control circuit for controlling the outputs of the LNA 11 and the variable amplifiers 15i, 15q. In this regard, a baseband control circuit in a baseband section which is not shown outputs a gain controller control signal to the gain controller 18, by which the gain controller controls them.

This receiver is built in an RFIC chip.

In the following, a problematic phenomenon addressed by the present invention is discussed.

Figure 2:
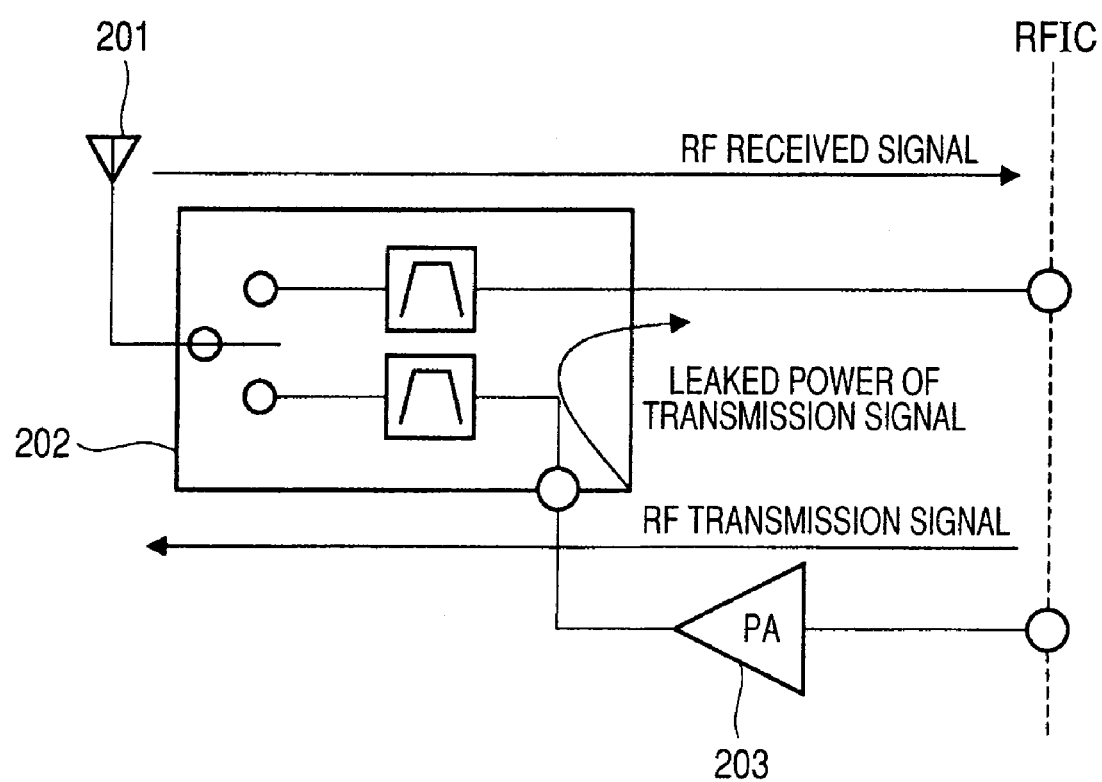
FIG. 2 is a conceptual diagram representing a problem occurring in a circuit section in the vicinity of an RFIC chip including the receiver of FIG. 1.

FIG. 2 is a conceptual diagram representing a problem occurring in a circuit section in the vicinity of the RFIC chip including the receiver of FIG. 1. FIGS. 3(a) and 3(b) are conceptual diagrams representing the proportions of signal components input to the receiver of FIG. 1.

FIG. 2 depicts a circuit section from an antenna by which RF received signals are received to an input boundary of the RFIC chip including the receiver shown in FIG. 1. In the circuit section in the vicinity of the RFIC, an antenna 201, a duplexer 202, and a power amplifier for transmission 203 are included.

The antenna 201 is a wireless part that transmits RF transmission signals and receives RF received signals.

The duplexer 202 is an antenna duplexer for allowing a single antenna 201 to be commonly used by both a transmission circuit section and a receiving circuit section.

The power amplifier for transmission 203 is a power amplifier for appropriately amplifying transmission signals into which I and Q components have been combined. In some transmission schemes, a filter for transmission which is not shown may be inserted between the power amplifier for transmission 203 and the RFIC. However, this is a matter of design and there is no description about it.

Operation of this circuit section in the vicinity of the RFIC is briefly described below. When an RF signal is received, the RF received signal input from the antenna 201 is input via the duplexer 202 to the RFIC chip shown in FIG. 1. On the other hand, when an RF signal is transmitted, after the RF transmission signal is amplified to a predetermined level by the power amplifier for transmission 203, it is output via the duplexer 202 from the antenna 201.

Here, leakage of the RF transmission signal from the power amplifier for transmission 203 to the receiving circuit section is problematic. Further explanation about this leakage amount is provided, using FIGS. 3(a) and 3(b).

FIG. 3(a) is a conceptual diagram with regard to frequencies to be used for CDMA-FDD. FIG. 3(b) is a diagram representing the proportions of a wanted wave component and noise components produced in the CDMA-FDD.

In the CDMA-FDD, transmission and reception use different frequencies. This is represented as a "difference between frequencies of TX and RX signals" in FIG. 3(a).

In general, RF transmission signals amplified within a mobile terminal device have a larger power than RF received signals received from outside the device. As can be seen in FIG. 3(a), the RF transmission signal has a larger power level than the RF received signal. When leakage of this RF transmission signal to the receiving circuit section occurs, it has an adverse effect on the RF received signal as a noise. This is represented as "IM2" in FIG. 3(b).

Moreover, when such a leak signal is multiplied by a local signal in the mixers 13i, 13q, some component appears as a noise. When a local signal is not an ideal signal, but has a phase noise, an interference wave from the antenna is mixed with the phase noise of the local signal, which in turn causes a deteriorated SNR. This phase noise of the local signal is denoted as "RX phase noise" in FIG. 3(b).

In addition, there are disturbances in a general air space, a noise introduced by a transmitter device not shown, and the like. They are denoted as "other noise" in FIG. 3(b).

If the sum of a total of the above three types of noises and the RF received signal does not reach a certain proportion or more, a significant RF received signal cannot be extracted. This "certain proportion" is denoted as a target SNR (Signal/Noise Ratio). Of course, it can be said that the stronger the RF received signal, the better will the receiving condition.

Figure 4:
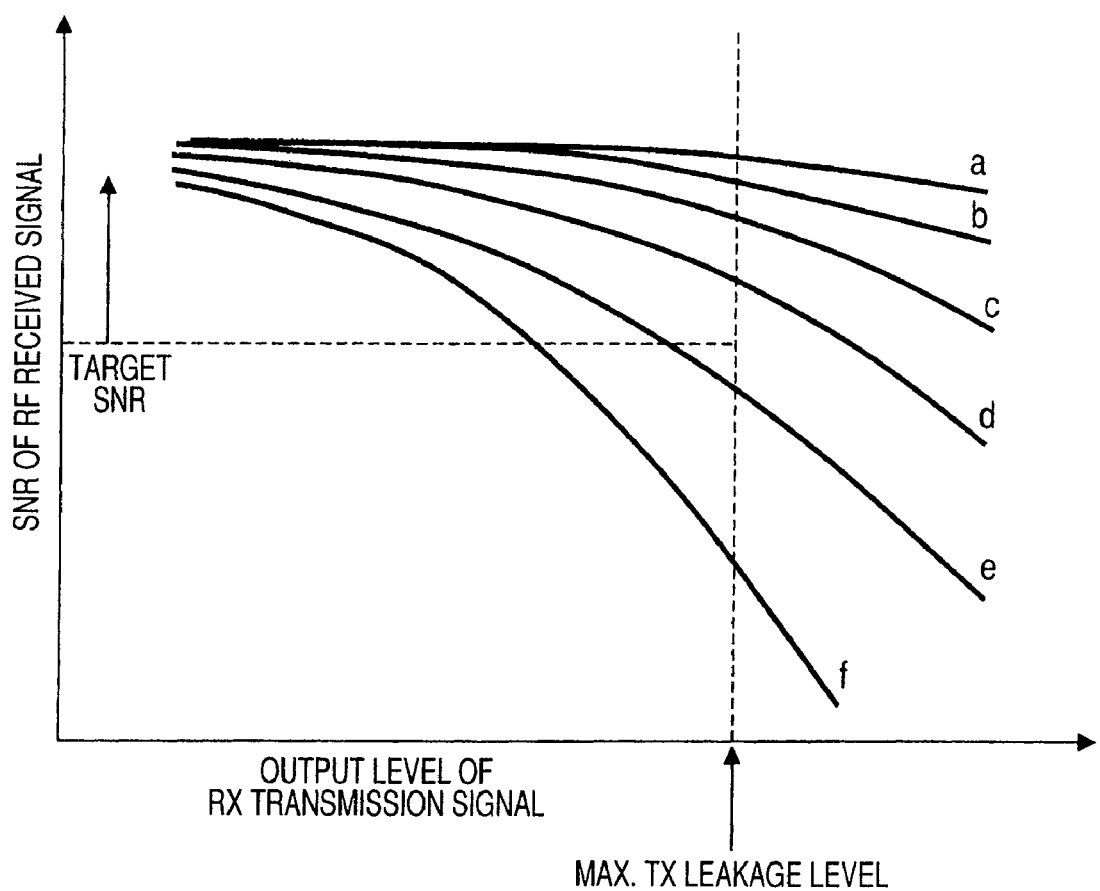
FIG. 4 is a graph representing how RX phase noise influences RX received signal.

FIG. 4 is a graph representing how the "RX phase noise" influences RX received signal. In this graph, the output level of RF transmission signal is plotted along the abscissa and SNR of RF received signal is plotted along the ordinate. Curves a-f of measurements in the graph indicate the measurements of power density of RX phase noise per Hz (in units of dBc/Hz). Curve f represents the highest power density of RX phase noise and curve a the lowest power density of RX phase noise. Power density ordering of curves a-f is as follows: a<b<c<d<e<f.

For curves a-d indicating a lower power density of RX phase noise, it is possible to attain the target SNR even if there is a maximum leakage power of RF transmission signal (Max. TX Leakage Level in the graph). For curves e and f indicating a higher power density of RX phase noise, it is impossible to attain the target SNR.

Figure 5:
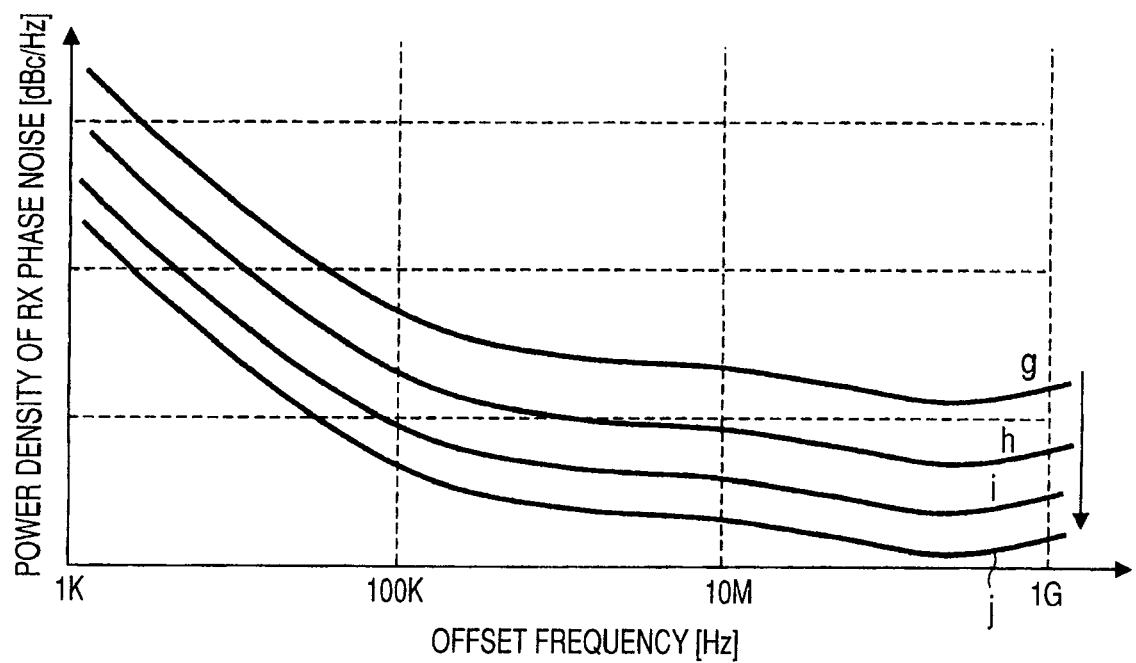
FIG. 5 is a graph representing how much phase noise occurs depending on a frequency offset from the standard signal frequency.

FIG. 5 is a graph representing how much phase noise occurs depending on a frequency offset from the standard signal frequency. Offset frequency is plotted along the abscissa and power density of RX phase noise per Hz is plotted along the ordinate.

Here, the offset frequency is a value indicating how far the frequency is away from the frequency of 0 Hz of the standard signal.

The phase noise is a noise produced due to a time jitter occurring which means a quick and jumpy fluctuation of signal with time. The phase noise is expressed by the following equation.

$$V(t) = Vo \times \mathrm{Sin}(2\pi ft + x) \qquad \text{Equation (1)}$$

Here, x is offset frequency plotted on the abscissa.

When x=0, no noise is produced. However, the phase noise assumes a large value, if x is a small value of offset frequency. As can be seen in FIG. 5 as well as Equation (1), the smaller the offset frequency, the larger will be the RX phase noise.

In this graph, four curves of measurements tagged with g through j are plotted. This difference is due to a difference in the amount of current flowing through an emitter follower circuit (one out of a set of emitter follower circuits 102 in FIG. 7) of the frequency divider 17. Curve g represents the smallest amount of the current and curve j represents the largest amount of the current (g<h<i<j). That is, this graph indicates that RX phase noise can be suppressed, if the current flowing through this emitter follower circuit is larger.

Conversely, if transmission wave power is small, that is, receiving gain is set low, power consumption can be reduced by decreasing the amount of the current flowing through the emitter follower circuits.

Among the above three types of noises, "other noise" cannot be controlled within the receiver, because it is an external influence. Thus, the present invention aims at attaining a low noise by handling "RX phase noise" and "IM2" appropriately. What is controlled is the amount of the current flowing through the emitter follower circuits in the frequency divider 17 and the invention is characterized in that reducing noise is achieved by controlling this amount of the current.

Figure 6:
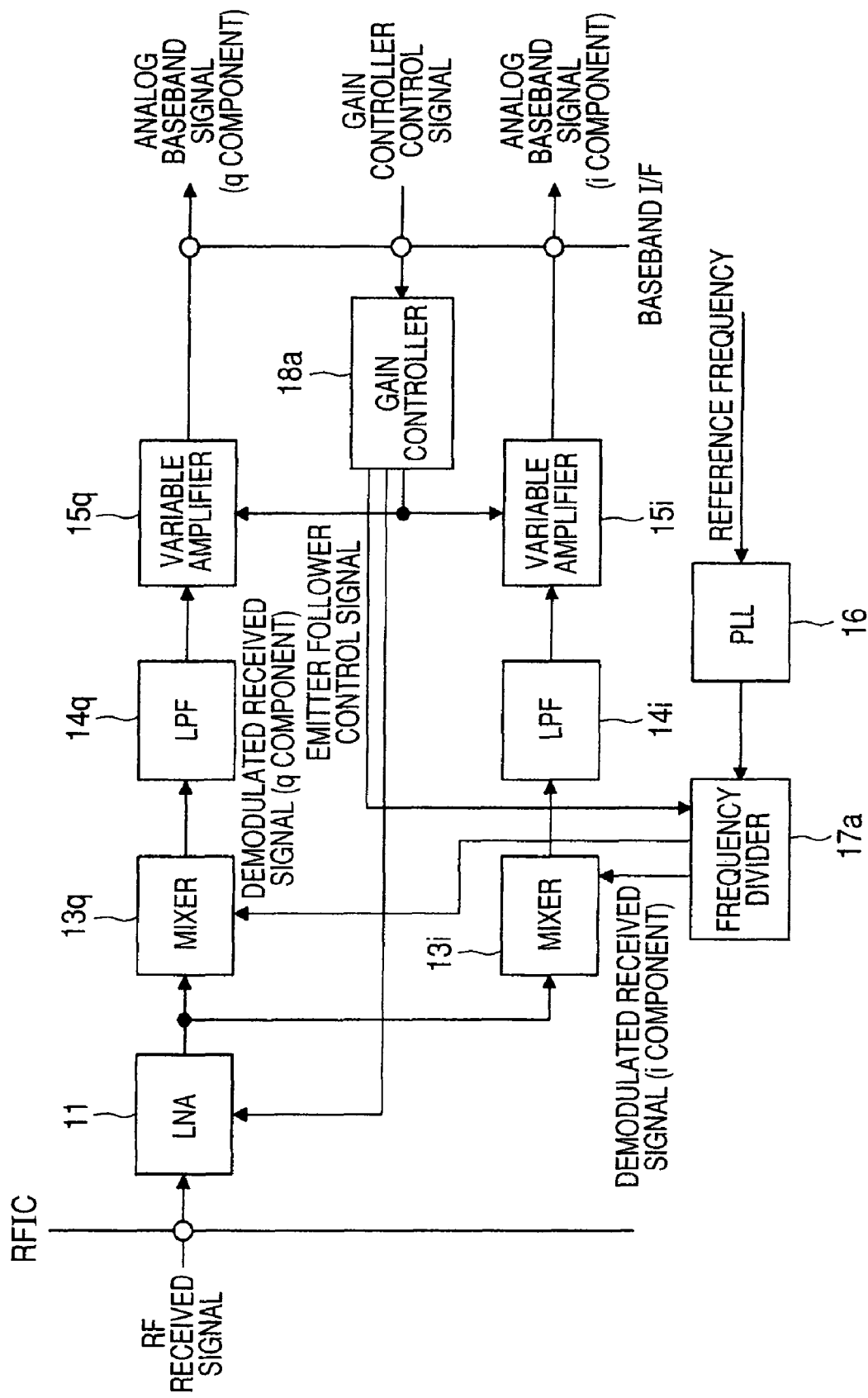
FIG. 6 is a block diagram showing a configuration of a receiver pertaining to a first embodiment of the present invention.

FIG. 6 is a block diagram showing a configuration of a receiver pertaining to a first embodiment of the present invention.

This receiver includes an LNA 11, mixers 13i, 13q, LPFs 14i, 14q, variable amplifiers 15i, 15q, a PLL 16, a frequency divider 17a, and a gain controller 18a. As already noted, the BPF 12 is removed in the present embodiment. Components which differ from those in prior art are subscripted with "a".

What differs from the frequency divider 17 is that the frequency divider 17a receives from the gain controller 18a a control signal (emitter follower control signal) for controlling the currents flowing through the emitter follower circuits.

The gain controller 18a controls the variable amplifiers 15i, 15q, monitoring the output of the LNA 11; this aspect is the same as the gain controller 18. However, the gain controller 18a for the present embodiment controls emitter follower currents in the frequency divider 17a, which differs from the gain controller 18.

Next, how the gain controller 18a operates is explained. If the gain controller increases the gain of the variable amplifiers 15i, 15q depending on the result of the output of the LNA 11, it tries to improve noise by increasing the current of a local signal from the frequency divider 17a. On the other hand, if the gain controller 18a determines that there is no need for increasing the gain of the variable amplifiers 15i, 15q, it reduces the current consumption by decreasing the current of a local signal from the frequency divider 17a.

Figure 7:
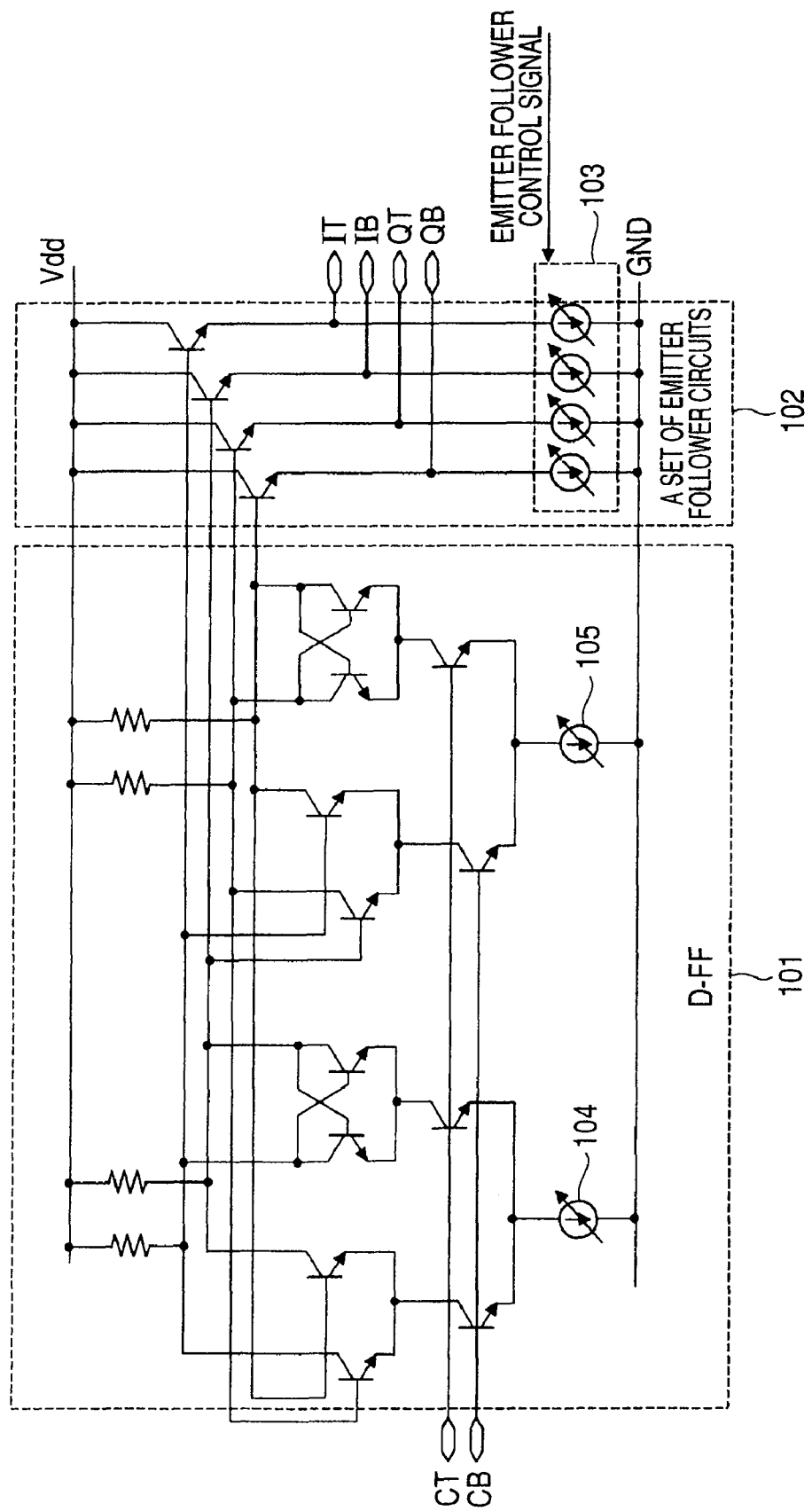
FIG. 7 is a circuit configuration diagram of a frequency divider for the first embodiment of the present invention.

FIG. 7 is a circuit configuration diagram of the frequency divider 17a for the first embodiment of the present invention. This frequency divider 17a includes a D-FF 101 and a set of emitter follower circuits 102. To input terminals CT, CB of the frequency divider 17a, a high frequency signal and its polarity inverted signal which are output by the PLL 16 are input. On the other hand, its outputs IT, IB are a local signal and its polarity inverted signal which are output to the mixer 13i handling an I component and its outputs QT, QB are a local signal and its polarity inverted signal which are output to the mixer 13q handling a Q component.

Moreover, an emitter follower control signal which characterizes the present invention is input from the gain controller 18a.

The D-FF 101 is a D flip-flop circuit which is an essential component of the divider. The D-FF 101 in the present embodiment has a total of four outputs by combination of positive and negative phases of 0 and 90 degrees, respectively.

In the D-FF shown in FIG. 7, constant current sources 104, 105 are inserted, as the D-FF is assumed to comprise bipolar transistor components. This is because its outputs become too high due to pseudo-differential operation of the bipolar transistor components. If the D-FF comprises CMOS components, these constant current sources 104, 105 are dispensed with (therefore, the constant current sources 104, 105 do not exist in another embodiment of FIG. 14 which will be described later).

The set of emitter follower circuits 102 is a set of collector grounding circuits (emitter follower circuits) which amplify output currents of the D-FF 101. Each emitter follower circuit includes a resistor (which is represented as a variable current source 103 in FIG. 7) between an emitter terminal of a transistor and a ground. By changing the resistance value of this resistor, the outputs of the emitter follower circuits, i.e., the output currents of the D-FF 101 are allowed to change. In doing so, the above-mentioned emitter follower control signal is used.

Figure 8:
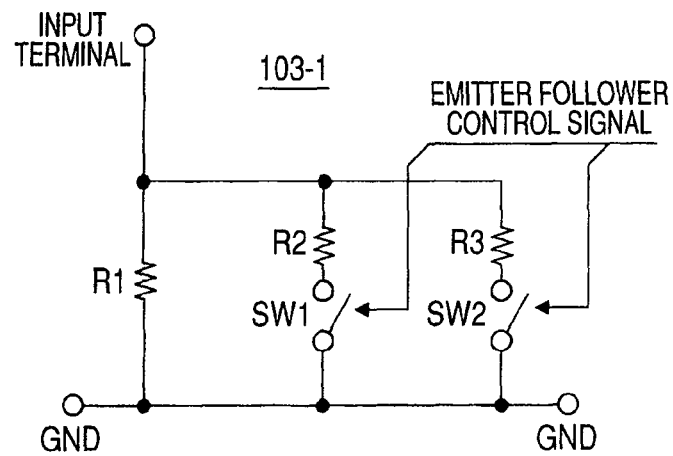
FIG. 8 is a circuit diagram showing a simplest configuration of a variable current source.

FIG. 8 is a circuit diagram showing a simplest configuration of the variable current source 103. That is, the variable current source 103-1 is comprised of resistors R1, R2, R3, and switches SW1 and SW2 for electrically decoupling the R2 and R3, respectively, from the circuit.

In particular, by opening and closing the switches SW1, SW2, this circuit can have one of the following four resistance values: 1) a resistance of R1; 2) a resistance of R1×R2/(R1+R2); 3) a resistance of R1×R3/(R1+R3); and 4) a resistance of R1×R2×R3/(R1×R2+R2×R3+R1×R3). This variable current source 103-1 is not a constant current source in a strict sense, because its current changes by a potential difference between GND and its input terminal.

Figure 9:
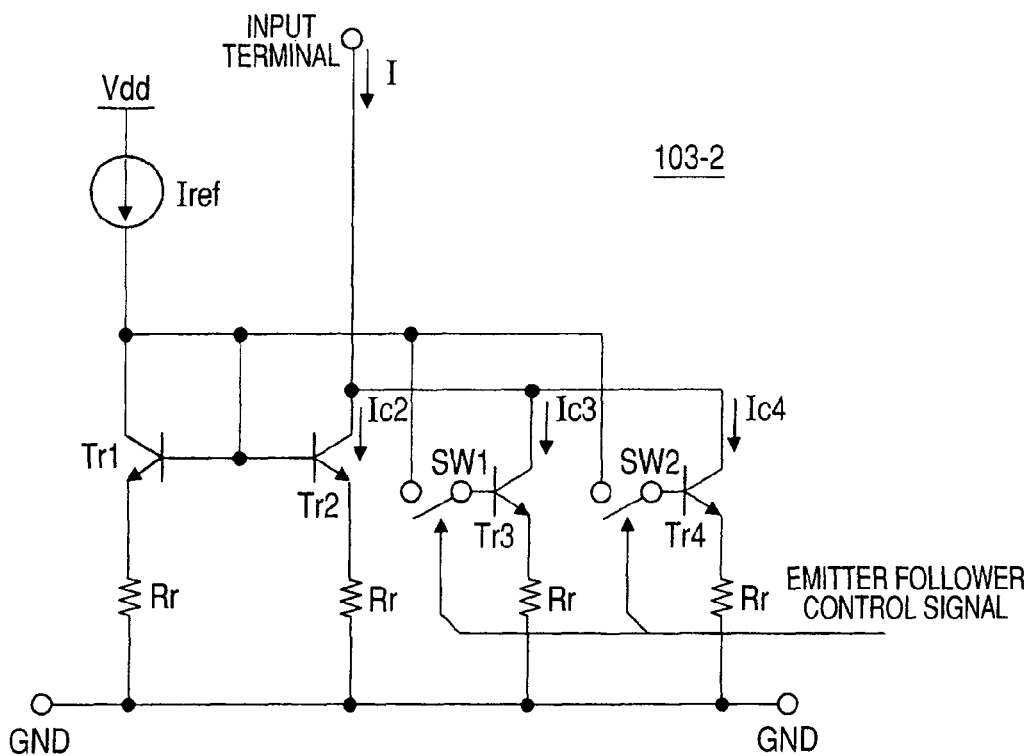
FIG. 9 is a circuit diagram showing a configuration of the variable current source employing a current mirror circuit.

FIG. 9 is a circuit diagram showing a configuration of the variable current source 103 employing a current mirror circuit. This variable current source 103-2 is a current mirror circuit comprised of a constant current source Iref and four transistors Tr1, Tr2, Tr3, Tr4.

The current mirror circuit is a very commonly used circuit for copying a current. As in FIG. 9, if it is assumed that resistors that are coupled to the emitter terminals of all transistors have equal resistance values (denoted by Rr in FIG. 9), and if the switches SW1, SW2 closed, there will be provided three forms of current mirror circuits. Thereby, there is a relation of Ic2=Ic3=Ic4=Iref, where I is thus allowed to change to be one of the following three current values: 1) a current of Iref; 2) a current of double Iref; and 3) a current of triple Iref. If the resistors coupled to the emitter terminals of the transistors are configured to have different values of resistance, the current is allowed to change in a combination of four or more current values.

Figure 10:
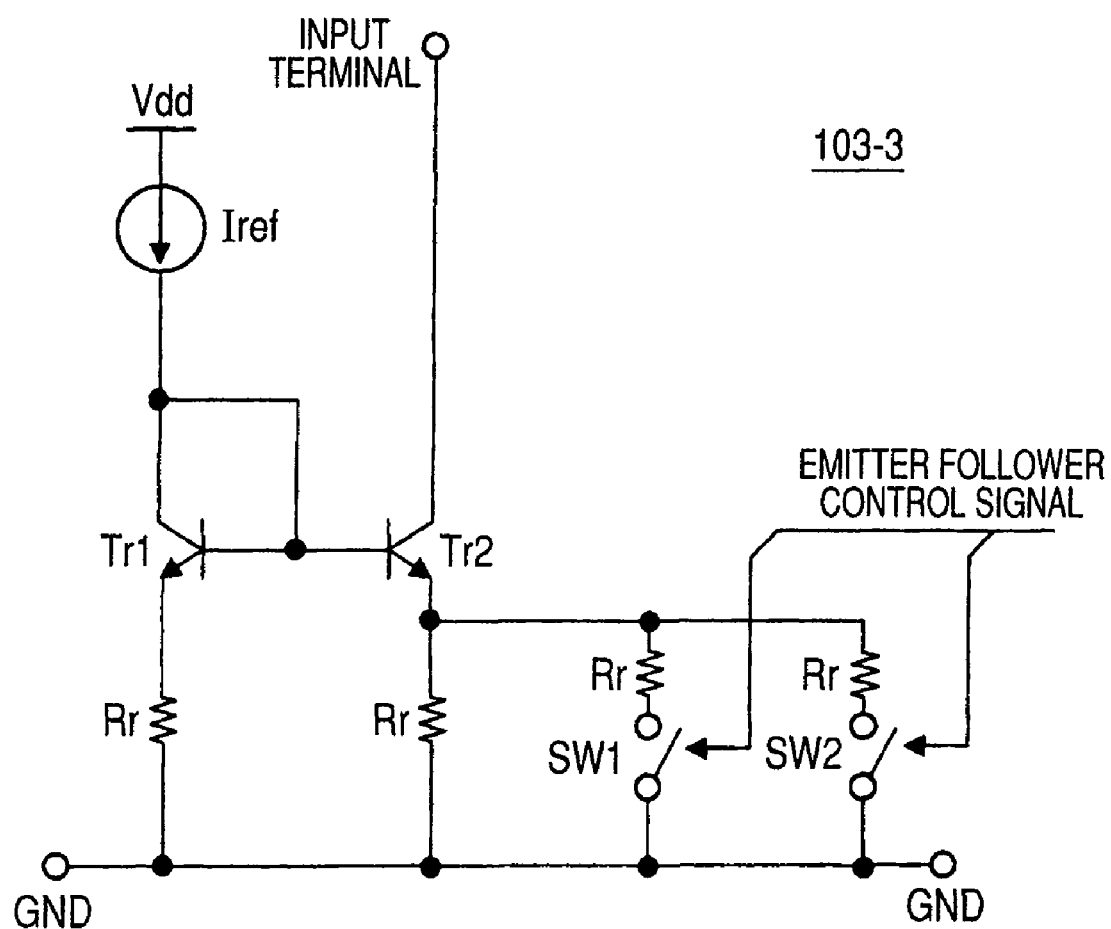
FIG. 10 is a circuit diagram showing another configuration of the variable current source employing a current mirror circuit.

FIG. 10 is a circuit diagram showing another configuration of the variable current source 103 employing a current mirror circuit. Here is a constant current circuit 103-3 in which I is changed by changing the resistance values of the resistors between the emitters and GND.

Figure 11:
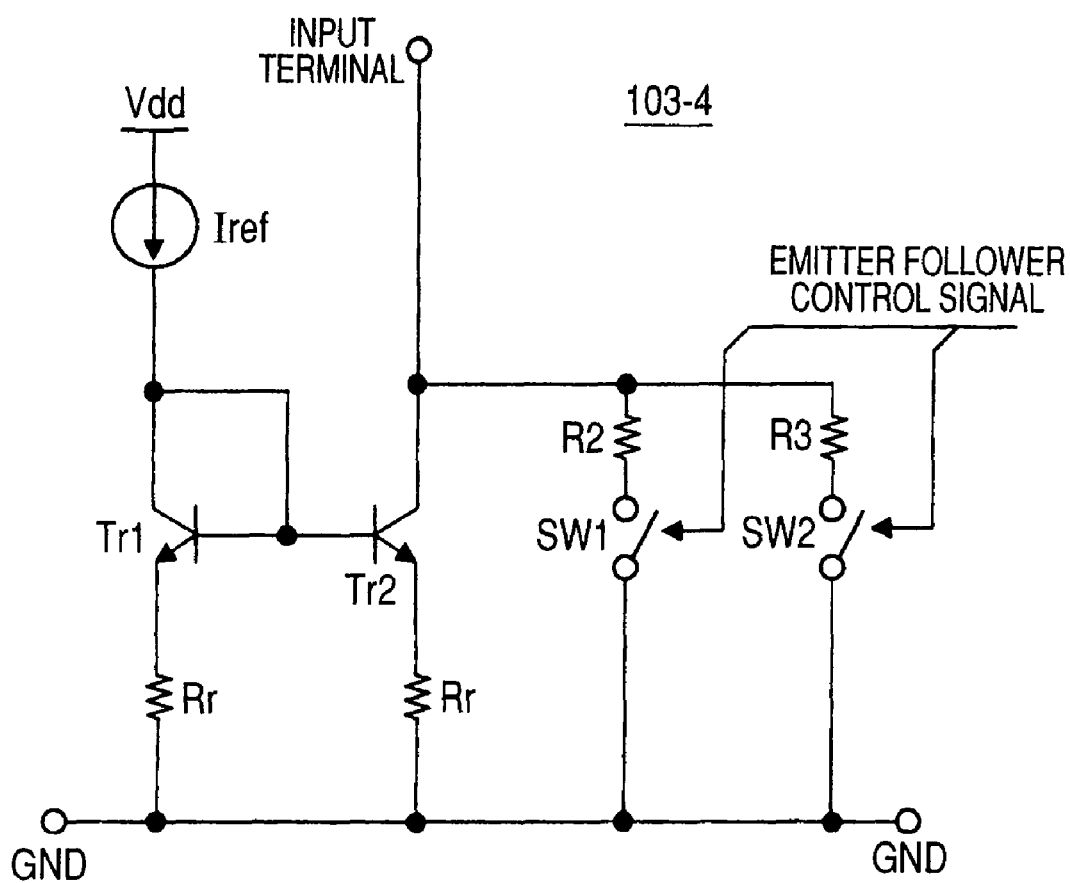
FIG. 11 is a circuit diagram showing yet another configuration of the variable current source employing a current mirror circuit.

FIG. 11 is a circuit diagram showing yet another configuration of the variable current source 103 employing a current mirror circuit. In a constant current circuit 103-4 of FIG. 11, resistance value change is combined with the use of a constant current source in one circuit. By employing the thus configured constant current circuit 103-4, it is also possible to configure a constant current circuit expected to operate accordingly in the present invention.

Figure 12:
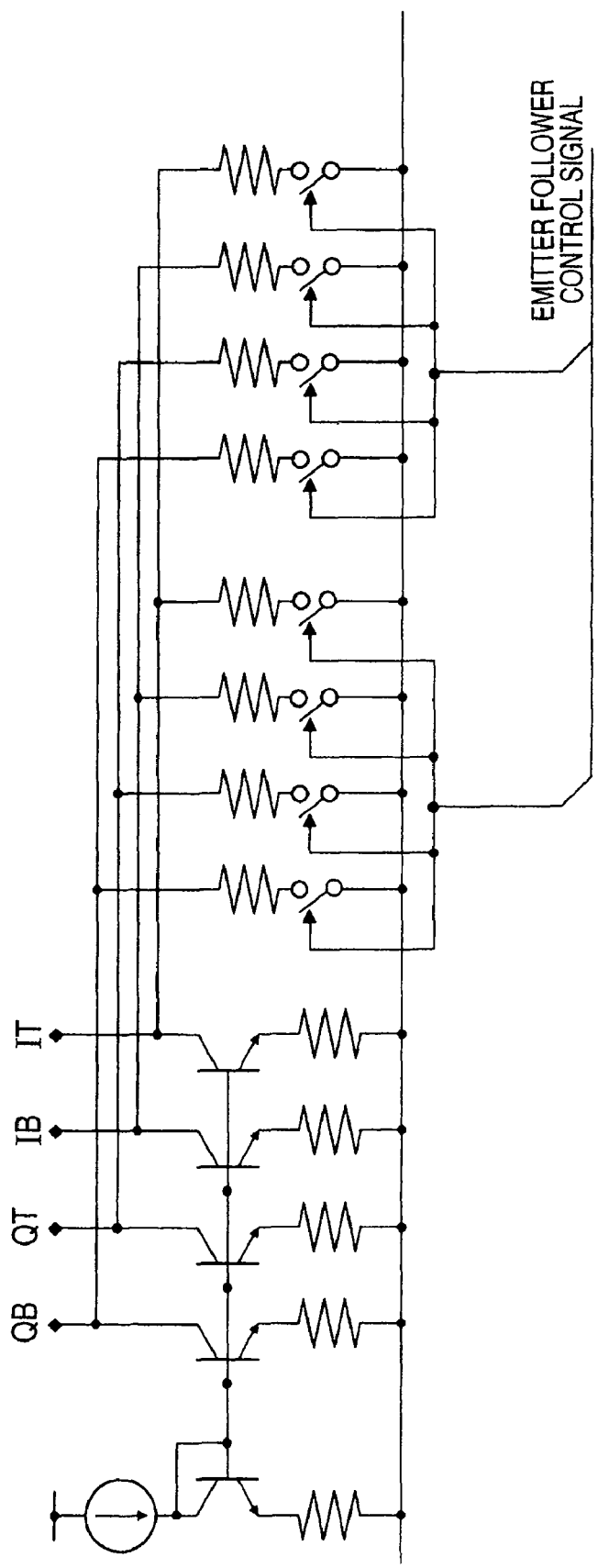
FIG. 12 is a diagram showing an overall configuration of a set of emitter follower circuits.

FIGS. 8 through 11 illustrate several ways of implementing the constant current source to be used individually for one emitter follower circuit. In contrast, FIG. 12 is a diagram showing an overall configuration of the set of emitter follower circuits 102. This circuit of FIG. 12 is configured to handle the four outputs of the D-FF 101. However, this configuration is characterized in that one constant current source is only used for all the outputs.

Accordingly, the circuit of FIG. 11 is configured for each of four currents obtained from the one constant current source. This can minimize the packaging scale, while adjusting the emitter follower currents, which is a primary purpose. In consequence, the amplitude of local signals which are input to each of the mixers 13$i$, 13$q$ increases so that noise can be suppressed.

Next, operation of the receiver as a whole is described.

Figure 13:
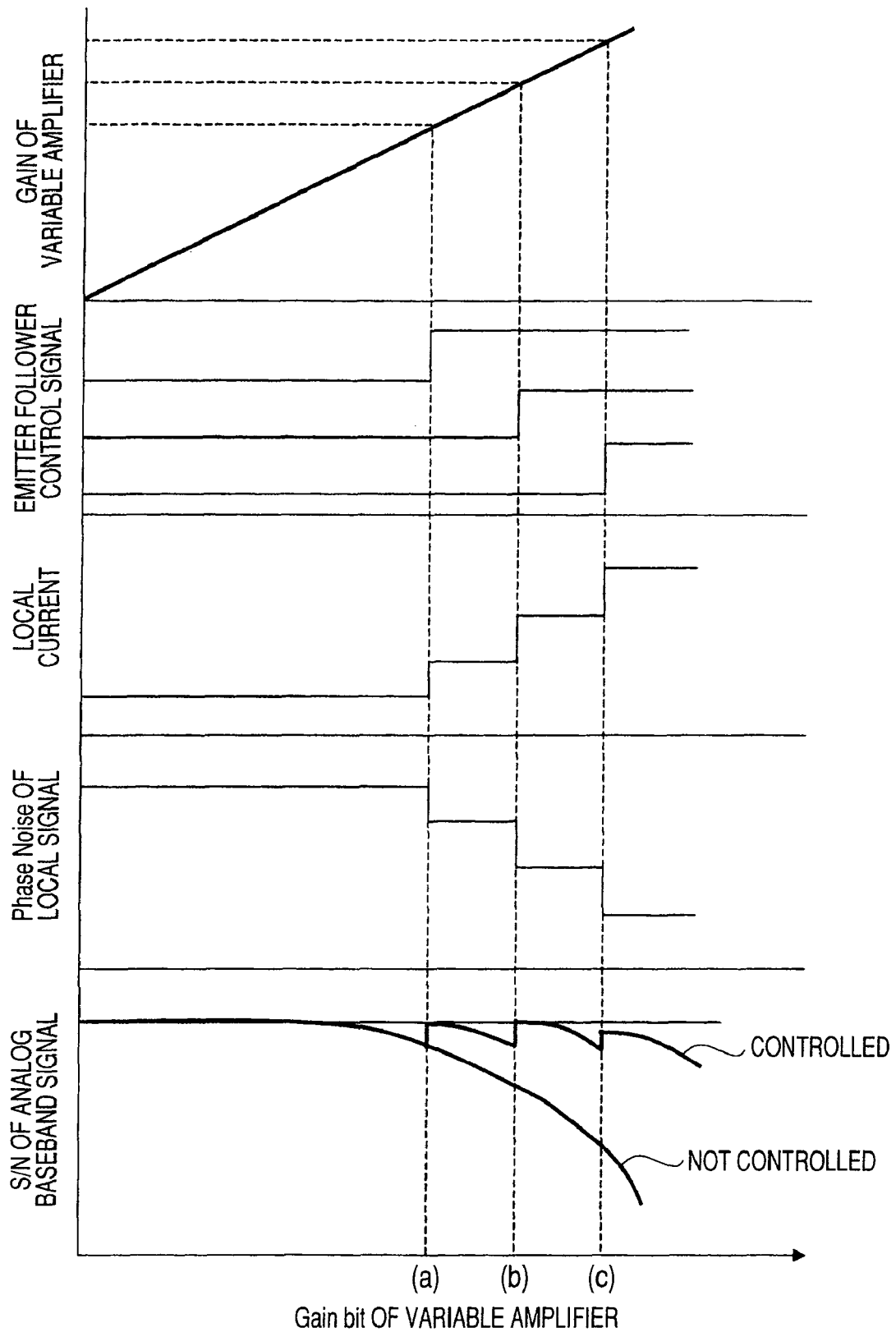
FIG. 13 is a graph representing an operating condition of the receiver pertaining to the first embodiment of the present invention.

FIG. 13 is a graph representing an operating condition of the receiver pertaining to the first embodiment of the present invention.

The amplitude of local signals (i.e., the outputs of the emitter follower circuits) first remains low, while a given S/N ratio (signal/noise ratio) is obtained in the baseband section. Thus, the output currents of the emitter follower circuits in the set of emitter follower circuits 102 are controlled to remain at the lowest level.

When the S/N ratio comes down from the given value, that is, when the outputs of the variable amplifiers 15$i$, 15$q$ have exceeded a given level of gain, a baseband control circuit which is not shown instructs the gain controller 18 to change the emitter follower control signal to increase the local currents (at a point of (a) in FIG. 13). This improves the phase noise of the local currents, thus improving the S/N ratio as well.

After that, when the possibility that the S/N ratio still deteriorates has increased (i.e., when the gain of the variable amplifiers 15$i$, 15$q$ has increased), the baseband control circuit not shown instructs the gain controller 18 to change the emitter follower control signal to increase the local currents (at a point of (b) in FIG. 13). When the S/N ratio has further deteriorated, the same action is repeated (at a point of (c) in FIG. 13). Such action makes it possible to maintain a good S/N ratio of analog baseband signals for a longer period.

FIG. 13 assumes a situation where change among four levels of local currents is allowed, since such change is assumed in FIGS. 8 through 12. It is possible to allow change among more levels of local currents or restrict change among or between fewer levels of local currents.

If the amounts of output currents of the frequency divider 17$a$ can be adjusted, it is not always necessary to employ the emitter follower circuits and the set of the emitter follower circuits. Other current adjustment means may be used.

In the foregoing description, when the S/N ratio is assumed to deteriorate, the action is performed to instruct the gain controller to increase the local currents. However, there is no limitation to this. When the baseband section performs receive processing, upon detecting an S/N ratio deterioration actually, it may instruct the gain controller to increase the local currents.

Second Embodiment

Next, a second embodiment of the present invention is described.

In the first embodiment, increasing or decreasing the local signal currents is performed by controlling the variable current sources 103 between the emitter terminals and GND in the set of emitter follower circuits 102.

In contrast, the second embodiment aims at making the local signal currents variable which are output by the frequency divider by handling a high frequency signal which is input to the frequency divider 17$a$.

Figure 14:
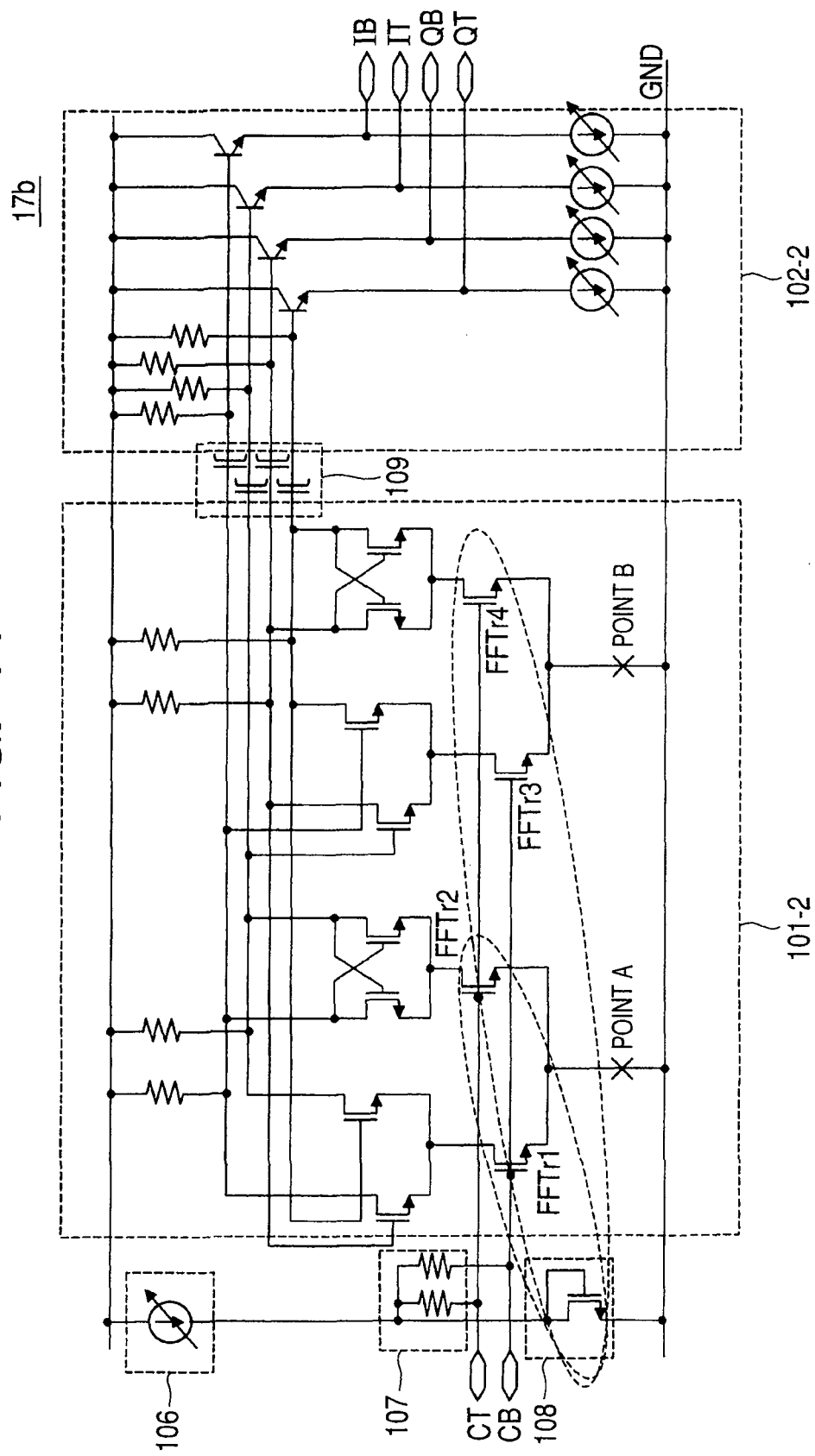
FIG. 14 is a circuit configuration diagram of a frequency divider for a second embodiment of the present invention.

FIG. 14 is a circuit configuration diagram of a frequency divider 17b for the second embodiment of the present invention.

The frequency divider 17b for the second embodiment is characterized in that a constant current source circuit 106, a resistor 107, and a transistor 108 are coupled to input signal terminals CT, CB. Moreover, a capacitor 109 is inserted between a D-FF 101-2 and a set of emitter follower circuits 102-2.

The transistor 108 is coupled via the resistor 107 to each high frequency signal input terminal CT, CB. The transistor 108 has a general constant current circuit configuration in which a base terminal and a collector terminal are short-circuited. This transistor 108 forms respective current mirror circuits with a transistor FFTr1 and a transistor FFTr4 included in the D-FF 101-2. In this regard, currents flowing through point A and point B in the D-FF 101-2 are adjusted by adjusting a current flowing through the transistor 108 with the constant current source circuit 106.

Currents flowing through the current mirror circuits formed by the transistor 108 with the transistor FFTr1 and with the transistor FFTr4 included in the D-FF 101-2 are determined by the constant current source 106. This constant current source 106 is a variable constant current source controllable by an external signal (i.e., the emitter follower control signal)

Figure 15:
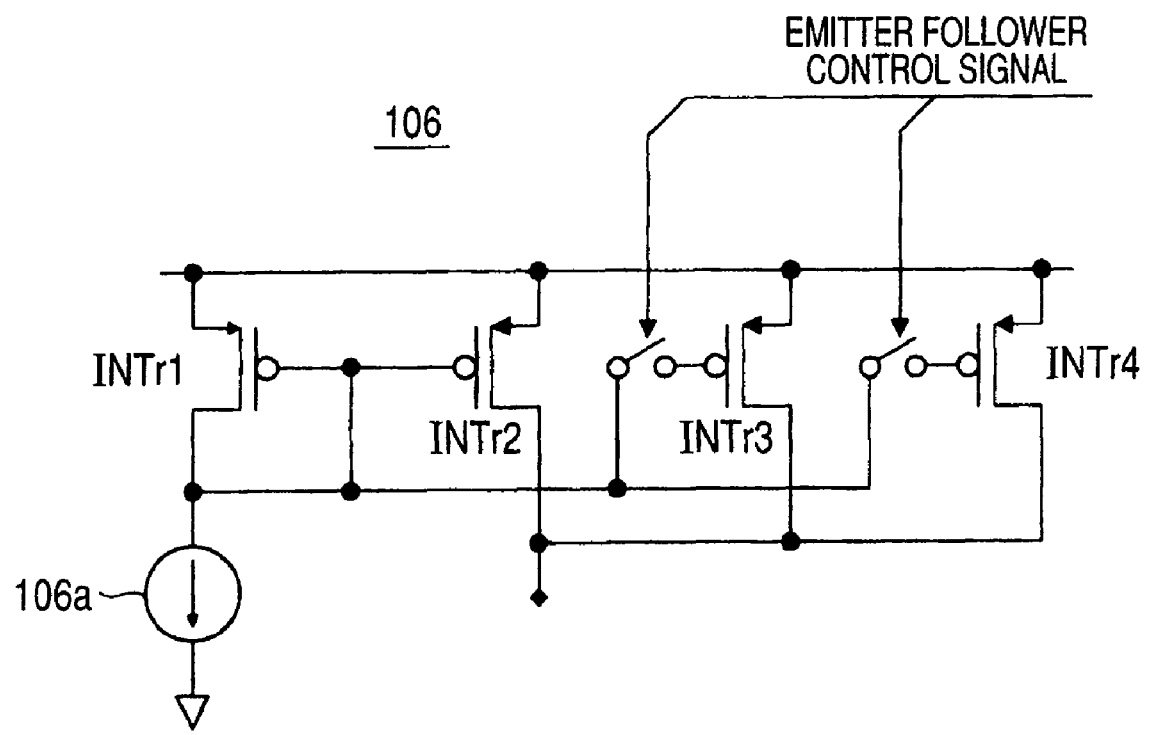
FIG. 15 is a circuit diagram showing a configuration of a constant current source circuit for the second embodiment of the present invention.

FIG. 15 is a circuit diagram showing a configuration of the constant current source circuit 106 for the second embodiment of the present invention.

In the constant current source circuit 106 as well, an internal transistor INTr1 constitutes current mirror circuits with a transistor INTr2 and with a transistor INTr4. A current value of a constant current source 106a is copied as an output of each transistor. For each transistor carrying out the copying, its base terminal is turned on/off by the emitter follower control signal. Thereby, a current equaling an integral multiple (n=1 to 3) of the constant current source 106a is allowed to flow through the transistor 108.

In this regard, it is desirable to insert the capacitor 109 between the D-FF 101-2 and the set of emitter follower circuits 102-2 from a viewpoint of avoiding a failure due to high amplitude.

As described above, the same advantageous effect as in the first embodiment can be achieved by adjusting the output signals of the D-FF 101-2 at the input side.

Third Embodiment

Next, a third embodiment of the present invention is described.

As already described with regard to FIGS. 2 and 3, one factor of deteriorating SNR is the leaked power of a transmission signal mainly attributed to a transmitter within the terminal. Current leaked from a transmission signal is largely influenced by the output of the transmitter. Conversely, when control is performed to increase the transmitter gain, the current leaked from a transmission signal can be coped with by increasing the emitter follower currents of the frequency divider in the receiver.

The third embodiment is characterized in that a gain controller of a transmitter performs control of the frequency divider 17a in the receiver, using the emitter follower control signal.

Figure 16:
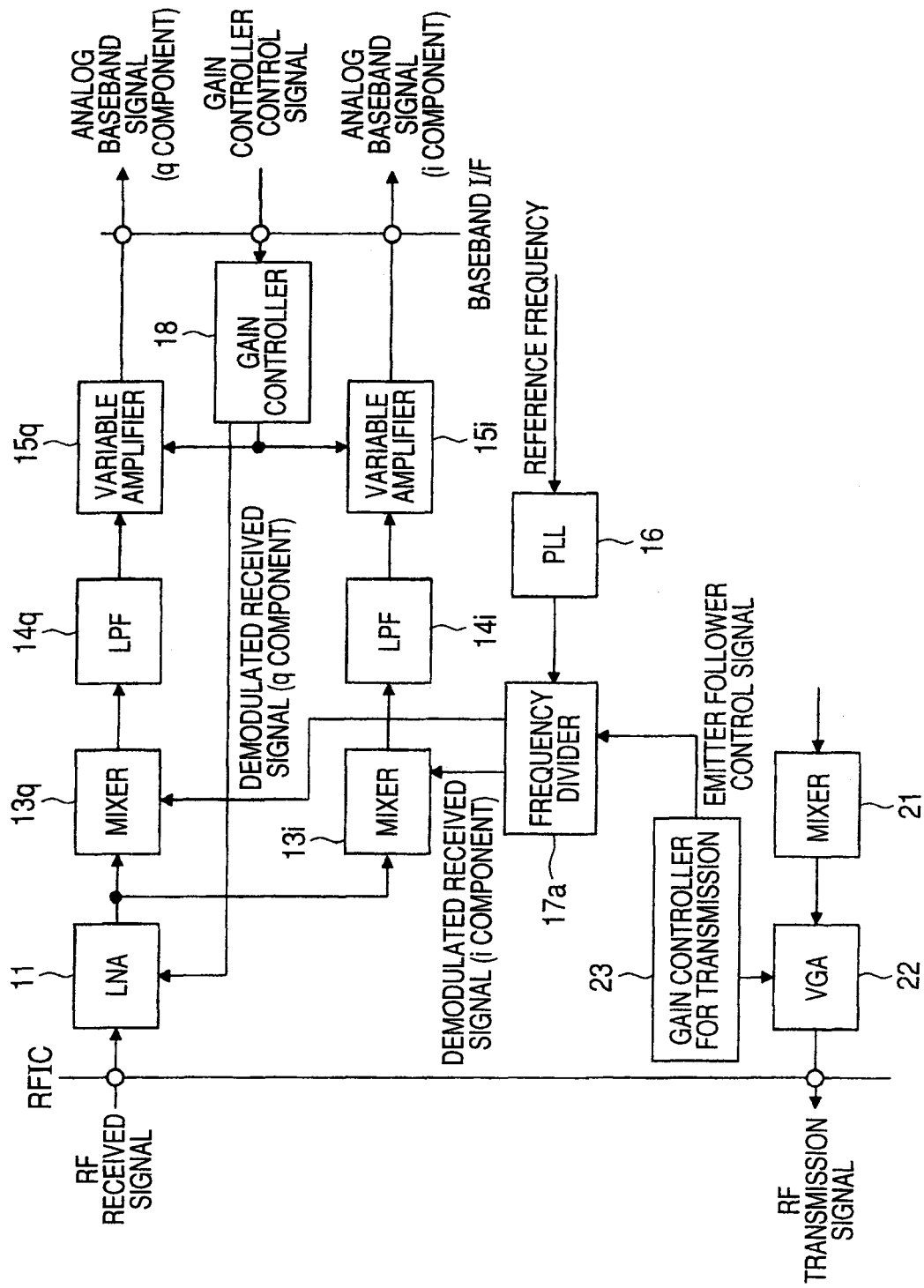
FIG. 16 is a block diagram showing a configuration of a transmitter and a receiver pertaining to a third embodiment of the present invention.

FIG. 16 is a block diagram showing a configuration of a transmitter and a receiver pertaining to the third embodiment of the present invention. A difference from FIG. 1 and FIG. 6 where only the receiver is illustrated lies in that FIG. 16 also includes the transmitter in part.

The transceiver pertaining to the third embodiment includes an LNA 11, mixers 13i, 13q, LPFs 14i, 14q, variable amplifiers 15i, 15q, a PLL 16, a frequency divider 17a, a gain controller 18, a mixer 21, a VGA 22, and a gain controller for transmission 23.

In the third embodiment, the gain controller 18 does not output the emitter follower control signal. Therefore, the conventional gain controller 18 is used as is.

The mixer 21 is a mixer circuit for converting a low frequency signal into a signal with a transmission frequency by multiplying a signal to be transmitted by a local signal for transmission. Although a signal that is input to this mixer needs to be generated in a practical transmitter, this aspect is not directly related to the present invention and, therefore, its description is dispensed with.

The VGA 22 is a variable gain amplifier. The VGA 22 is controlled by the gain controller for transmission 23.

The gain controller for transmission 23 is a control circuit for determining an amplification factor of the VGA 22. Various parameters for increasing or decreasing the amplification factor are conceivable. In the third embodiment, when the gain controller for transmission 23 increases the amplification factor of the VGA 22, the local signals to be output by the frequency divider 17a increase via the emitter follower control signal, thus suppressing noise. With a decrease in the amplification factor of the VGA 22, the local signals to be output by the frequency divider 17a decrease, thereby reducing the power consumption.

By thus controlling the transmitter gain, it is possible to suppress noise mainly attributed to the current leaked from a transmission signal and minimize an increase in the power consumption.

Fourth Embodiment

Figure 17:
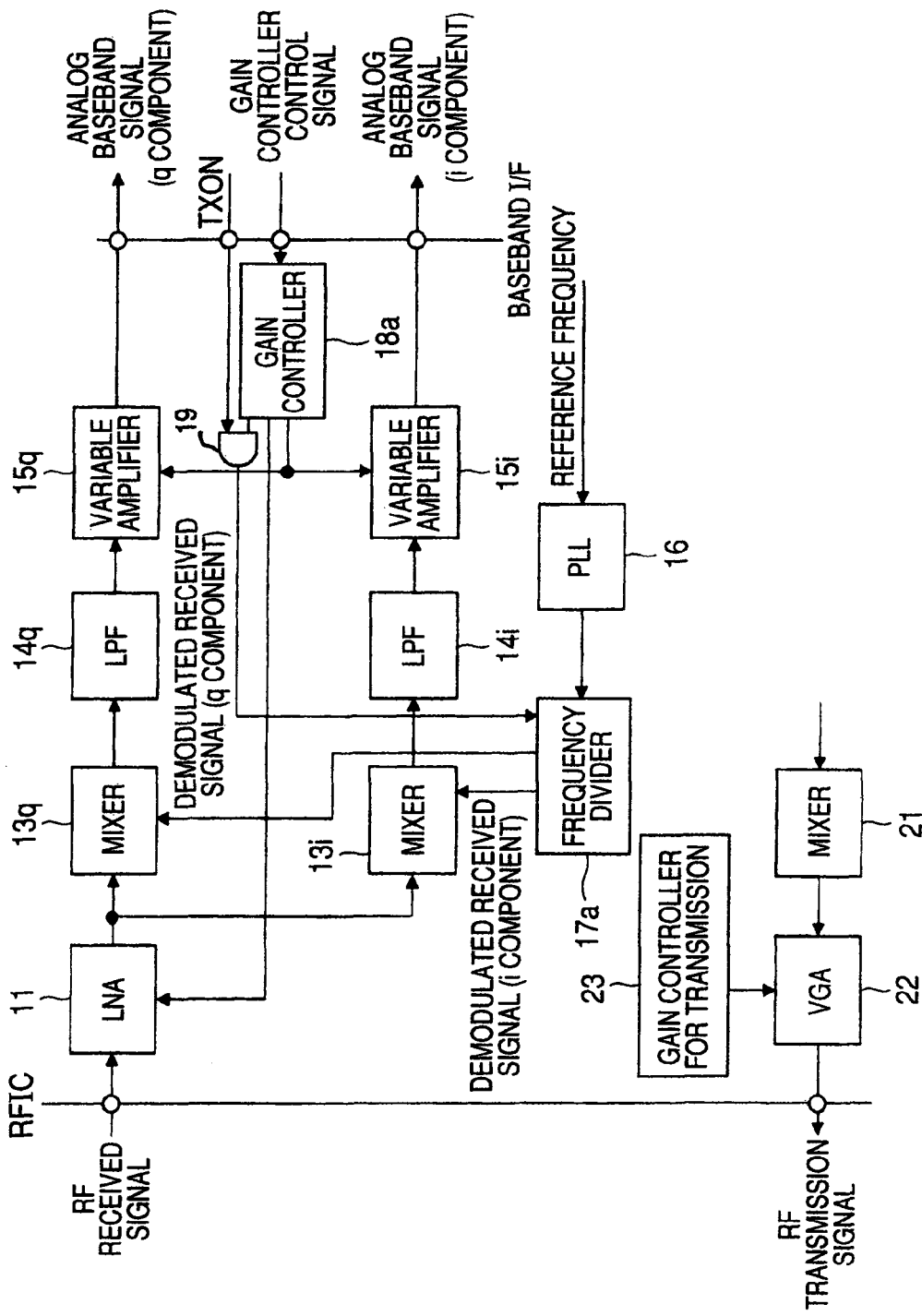
FIG. 17 is a block diagram showing a configuration of a transmitter and a receiver pertaining to a fourth embodiment of the present invention.

Next, a fourth embodiment of the present invention is described. FIG. 17 is a block diagram showing a configuration of a transmitter and a receiver pertaining to the fourth embodiment.

In the W-CDMA system using FDD, usually, there are two modes: 1) a mode in which both the transmitter and the receiver operate and 2) a mode in which only the receiver operates. In a cellular mobile phone, the receiver always operates, as it needs to await an incoming call or packet, but the transmitter is activated by the user to initiate a verbal or packet communication. Thus, the mobile phone has these two modes.

When in the mode of 2) in which only the receiver operates, the transmitter-related components such as the mixer 21, VGA 22, and gain controller for transmission 23 are inactive to reduce power consumption. Naturally, no leak signal to the receiver occurs during the mode of 2) in which only the receiver operates. Thus, because there is no deterioration of SNR of the receiver caused by a transmission wave, it is reasonable to reduce current consumption by decreasing the amount of local signal currents in the receiver side.

Of course, the baseband section knows whether the mobile phone is now placed in the mode of 1) in which both the transmitter and the receiver operate or the mode of 2) in which only the receiver operates. Thus, a purpose of the fourth embodiment is as follows: based on an input signal from the baseband section, adjustment of the currents output by the emitter follower circuits is deactivated, that is, the receiver is forced to operate with the lowest amount of local currents up to the point of (a) in FIG. 13 during the mode of 2) in which only the receiver operates.

The receiver pertaining to the fourth embodiment comprises an LNA 11, mixers 13i, 13q, LPFs 14i, 14q, variable amplifiers 15i, 15q, a PLL 16, a frequency divider 17a, a gain controller 18a, and an AND gate 19. Because the basic configuration is the same as the receiver pertaining to the first embodiment, differences therefrom are only described.

The AND gate 19 is inserted between the gain controller 18a and the frequency divider 17a. Input signals to the AND gate 19 are the output of the gain controller 18a and a TXON signal which is output from the baseband control circuit not shown.

The TXON signal is a transmission mode flag signal indicating whether the transmitter operates (i.e., the mobile phone is placed in the mode of 1) in which both the transmitter and the receiver operate). When the signal on this signal line is "1", it indicates the mode of 1) in which both the transmitter and the receiver operate. When this signal is "0", it indicates the mode of 2) in which only the receiver operates.

According to the above condition, the AND gate 19 in the mode of 2) in which only the receiver operates does not output the output of the gain controller 18a to the frequency divider 17a. Therefore, the amount of local signal currents is restricted so that current consumption can be reduced.

While the invention made by the present inventors has been described specifically based on its embodiments hereinbefore, it will be appreciated that the present invention is not limited to the described embodiments and various modifications may be made without departing from the scope of the invention.

The present invention has been described, assuming that it is applied to an RFIC for wireless communication compliant with the W-CDMA protocol using the FDD method. However, there is no limitation to this. The invention is also assumed to be used in a mobile device operating with other communication protocols such as wireless LAN.

In the case of the first embodiment that only focuses on the receiver, the receiver can also be applied to an RFIC for wireless communication compliant with the W-CDMA protocol using the TDD method.

What is claimed is:

1. A receiver comprising:
a low noise amplifier which amplifies received signals received via an antenna;
a frequency divider which divides a frequency and generates a local signal;
mixers which mix said local signal and an output of said low noise amplifier;
programmable gain amplifiers which amplify outputs of said mixers; and
a gain controller which controls said programmable gain amplifiers,
wherein said frequency divider comprises a current amount adjustment means for adjusting the amount of currents to be output from its output terminals,
wherein a gain controller control signal to control said programmable gain amplifiers is input to said gain controller,
wherein said gain controller adjusts an amplification factor of said programmable gain amplifiers and the amount of currents to be output from the output terminals of said frequency divider according to the gain controller control signal,
wherein said current amount adjustment means comprises emitter follower current circuits, and
wherein a transmission mode flag signal is further input to the receiver and control of said frequency divider by said gain controller is deactivated when the transmission mode flag signal is negative.

2. A mobile terminal device using the receiver as set forth in claim 1.

3. A mobile terminal device using the receiver as set forth in claim 1.

4. A receiver comprising:
a low noise amplifier which amplifies received signals received via an antenna;
a frequency divider which divides a frequency and generates a local signal;
mixers which mix said local signal and an output of said low noise amplifier;
programmable gain amplifiers which amplify outputs of said mixers: and
a gain controller which controls said programmable gain amplifiers,
wherein said frequency divider comprises a current amount adjustment means for adjusting the amount of currents to be output from its output terminals,
wherein a gain controller control signal to control said programmable gain amplifiers is input to said gain controller,
wherein said gain controller adjusts an amplification factor of said programmable pain amplifiers and the amount of currents to be output from the output terminals of said frequency divider according to the gain controller control signal, and
wherein a transmission mode flag signal is further input to the receiver and control of said frequency divider by said gain controller is deactivated when the transmission mode flag signal is negative.

5. A mobile terminal device using the receiver as set forth in claim 4.

6. A transceiver comprising:
a low noise amplifier which amplifies received signals received via an antenna;
a receiver-side frequency divider which divides a frequency and generates a receiver-side local signal;
receiver-side mixers which mix said receiver-side local signal and an output of said low noise amplifier;
programmable gain amplifiers which amplify outputs of said receiver-side mixers;
a receiver-side gain controller which controls said programmable gain amplifiers;
a transmitter-side mixer which mixes a transmitter-side local signal and an analog baseband signal for transmission;
a variable amplifier which amplifies an output of said transmitter-side mixer; and
a transmitter-side gain controller which adjusts an amplification factor of said variable amplifier,
wherein said receiver-side frequency divider comprises a current amount adjustment means for adjusting the amount of currents to be output from its output terminals,
wherein said transmitter-side gain controller outputs a receiver-side gain controller control signal to said receiver-side gain controller in accordance with an amplification factor of said variable amplifier,
wherein said receiver-side gain controller adjusts said programmable gain amplifiers and the amount of currents to be output from said receiver-side frequency divider based on said receiver-side gain controller control signal, and
wherein a transmission mode flag signal is further input to the transceiver and control of said receiver-side frequency divider by the receiver-side gain controller is deactivated when the transmission mode flap signal is negative.

7. A mobile terminal device using the transceiver as set forth in claim 6.

* * * * *